(12) United States Patent
Min et al.

(10) Patent No.: US 8,493,418 B2
(45) Date of Patent: Jul. 23, 2013

(54) LIQUID CRYSTAL DISPLAY

(75) Inventors: Woong-Ki Min, Daegu (KR); Hong-Sung Song, Gumi-si (KR); Ju-Young Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 471 days.

(21) Appl. No.: 12/650,042

(22) Filed: Dec. 30, 2009

(65) Prior Publication Data

US 2010/0309236 A1 Dec. 9, 2010

(30) Foreign Application Priority Data

Jun. 3, 2009 (KR) ........................ 10-2009-0049244

(51) Int. Cl.
*G09G 5/10* (2006.01)

(52) U.S. Cl.
USPC ............................ 345/691; 345/690; 345/692

(58) Field of Classification Search
USPC ........... 345/87–102, 204, 212, 214, 690–692; 349/33, 58, 149, 150; 257/59
See application file for complete search history.

(56) References Cited

U.S. PATENT DOCUMENTS

| | | | |
|---|---|---|---|
| 6,853,361 B2 * | 2/2005 | Tsuyuki et al. ................. | 345/92 |
| 7,075,505 B2 | 7/2006 | Sakaguchi et al. | |
| 7,724,340 B2 * | 5/2010 | Kang et al. ..................... | 349/150 |
| 7,773,171 B2 * | 8/2010 | Kim et al. ........................ | 349/58 |
| 7,916,118 B2 * | 3/2011 | Ao et al. ......................... | 345/102 |
| 8,092,908 B2 * | 1/2012 | Ohta et al. ...................... | 428/408 |
| 2002/0054006 A1 * | 5/2002 | Tsuyuki et al. .................. | 345/87 |
| 2002/0171614 A1 * | 11/2002 | Sakaguchi et al. .............. | 345/88 |
| 2004/0036672 A1 * | 2/2004 | Yoo et al. ....................... | 345/102 |
| 2005/0134547 A1 * | 6/2005 | Wyatt ............................. | 345/102 |
| 2006/0164587 A1 | 7/2006 | Oh | |
| 2006/0274011 A1 * | 12/2006 | Igarashi et al. ................. | 345/94 |
| 2006/0274017 A1 * | 12/2006 | Nakao ............................. | 345/98 |
| 2006/0279507 A1 * | 12/2006 | Nakao et al. ................... | 345/98 |
| 2007/0046852 A1 * | 3/2007 | Kim et al. ...................... | 349/58 |
| 2007/0115685 A1 * | 5/2007 | Kondo et al. .................. | 362/561 |
| 2008/0018584 A1 * | 1/2008 | Park et al. ...................... | 345/99 |
| 2008/0043159 A1 * | 2/2008 | Wang et al. .................... | 349/33 |
| 2008/0161161 A1 * | 7/2008 | Pipinich et al. .................. | 482/8 |
| 2008/0174731 A1 * | 7/2008 | Kang et al. .................... | 349/150 |

FOREIGN PATENT DOCUMENTS

| | | |
|---|---|---|
| CN | 1299982 A | 6/2001 |
| CN | 1811890 A | 8/2006 |
| CN | 101097317 A | 1/2008 |

* cited by examiner

*Primary Examiner* — Prabodh M Dharia
(74) *Attorney, Agent, or Firm* — Birch, Stewart, Kolasch & Birch, LLP

(57) ABSTRACT

An LCD has a drive power supply structure simplified to simplify manufacturing processes of LCDs and to reduce manufacturing costs thereof. The LCD includes a liquid crystal panel, a drive unit, a controller, a backlight drive unit, and a drive voltage generator. The liquid crystal panel includes image display regions. The drive unit drives gate and data lines in the panel. The controller controls the drive unit using image data and synchronization signals from outside. The drive voltage generator is provided on a system or at least one source printed circuit board on which at least one of the drive unit or the controller is formed and converts a voltage level of a drive power provided from outside to generate drive powers of different voltage levels and provides the drive powers to the drive unit, the controller, and the backlight drive unit.

6 Claims, 4 Drawing Sheets

LIQUID CRYSTAL DISPLAY

This application claims the benefit of Korean Patent Application No. 10-2009-0049244, filed on Jun. 3, 2009, which is hereby incorporated by reference as if fully set forth herein.

BACKGROUND OF THE INVENTION

1. Field of the Invention

The present invention relates to a liquid crystal display, and more particularly, to a liquid crystal display having a drive power supply structure which is simplified so as to simplify manufacturing processes of LCDs and to reduce manufacturing costs thereof.

2. Discussion of the Related Art

A general Liquid Crystal Display (LCD) displays images by controlling optical transmittance of a liquid crystal layer using electric fields. To accomplish this, the LCD includes a liquid crystal panel having pixel regions arranged in a matrix, a drive circuit that drives the liquid crystal panel, and a backlight unit that emits light to the liquid crystal panel.

Generally, data integrated circuits in the drive circuit are attached to different source printed circuit boards or printed circuit films and gate integrated circuits therein are attached to one side of the liquid crystal panel or are formed directly on the liquid crystal panel. A timing controller or a drive system is separately provided on a separate control printed circuit board to provide control signals required for the gate and data integrated circuits. The backlight unit is separately provided on a rear side of the liquid crystal panel to receive control signals from the drive circuits.

However, the conventional LCDs have a problem in that the structure for supplying drive powers is complicated since components such as the backlight unit and the drive circuits for driving the liquid crystal panel receive drive powers from the outside. That is, since the components such as the backlight unit and the drive circuits require drive powers of different voltage levels and receive the required drive powers from an external power supply unit, the structure for generating drive powers of different voltage levels and the structure for supplying the drive powers are complicated. This complicates the manufacturing processes of LCDs and increases manufacturing costs thereof.

SUMMARY OF THE INVENTION

Accordingly, the present invention is directed to a liquid crystal display that substantially obviates one or more problems due to limitations and disadvantages of the related art.

An object of the present invention is to provide a liquid crystal display having a drive power supply structure which is simplified so as to simplify manufacturing processes of LCDs and to reduce manufacturing costs thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a liquid crystal display includes a liquid crystal panel including at least one image display region, a drive unit for driving gate and data lines included in the liquid crystal panel, a controller for controlling the drive unit using image data and synchronization signals received from outside, a backlight drive unit for driving a backlight to provide light to the liquid crystal panel under control of the controller, and a drive voltage generator provided on a system or at least one source printed circuit board on which at least one of the drive unit or the controller is formed, the drive voltage generator converting a voltage level of a drive power received from outside to generate respective drive powers of different voltage levels and providing the generated respective drive powers of the different voltage levels to the drive unit, the controller, and the backlight drive unit.

The drive unit includes a plurality of data integrated circuits provided between one side of the liquid crystal panel and the at least one source printed circuit board for driving data lines provided in the at least one image display region, and a plurality of gate integrated circuits provided on another side of the liquid crystal panel for driving data lines provided in the at least one image display region, and the controller includes a timing controller provided on one of the system or the at least one source printed circuit board for controlling the plurality of gate and data integrated circuits according to image data and a plurality of synchronization signals received from the system.

The drive voltage generator is formed on the at least one source printed circuit board or formed on a control printed circuit board formed separately from the source printed circuit board or is integrally formed on the system, and the timing controller is formed on the at least one source printed circuit board or the control printed circuit board or is integrally formed on the system.

The drive voltage generator includes at least one DC/DC converter, increases or decreases the voltage level of the drive power received from outside to a plurality of levels to generate respective drive voltages required to drive the plurality of gate and data integrated circuits, the timing controller, the system, and the backlight drive unit, and provides the generated drive voltages respectively to the plurality of gate and data integrated circuits, the timing controller, the system, and the backlight drive unit.

The drive voltage generator generates a gamma reference voltage that enables the data integrated circuits to convert the image data into an analog image signal and provides the generated gamma reference voltage to the data integrated circuits, generates respective gate drive voltages corresponding to a gate high voltage and a gate low voltage generated from the gate integrated circuits and provides the gate drive voltages to the gate integrated circuits, and generates a drive voltage corresponding to a backlight control signal required for on-off drive control of the backlight and provides the drive voltage corresponding to the backlight control signal to the backlight drive unit.

When the drive voltage generator is formed on the control printed circuit board, the drive voltage generator provides a plurality of drive voltages required for the data integrated circuits to the data integrated circuits through at least one first data connector, at least one data connection unit, at least one second data connector, at least one source printed circuit board, and respective data circuit films, the drive voltage generator provides a plurality of drive voltages required for the backlight drive unit to the backlight drive unit through a first backlight connector, a backlight connection unit, and a second backlight connector, the drive voltage generator provides a plurality of drive voltages required for the timing controller to the timing controller directly through the control printed circuit board and provides a plurality of drive voltages required for the system to the system through a first system connector, a system connection unit, and a second system connector, and the drive voltage generator provides a plurality of drive voltages required for the gate integrated circuits to the gate integrated circuits through the at least one first data connector, the data connection unit, the second data connector, the at least one source printed circuit board, and one of the data circuit films, the liquid crystal panel, and a gate circuit film.

When the drive voltage generator is formed on one source printed circuit board, the system is electrically connected to the timing controller and the drive voltage generator through a first system connector, a system connection unit, a second system connector, and the source printed circuit board, and the backlight drive unit is electrically connected to the timing controller and the drive voltage generator through a first backlight connector, a backlight connection unit, and the second system connector.

The drive voltage generator provides drive voltages required for the data integrated circuits to the data integrated circuits through the at least one source printed circuit board and the data circuit films or provides drive voltages required for the data integrated circuits to the data integrated circuits by additionally using a first sub-connector, a sub-connector, and a second sub-connector connected between the source printed circuit boards, the drive voltage generator provides a plurality of drive voltages required for the backlight drive unit to the backlight drive unit through the second system connector, the backlight connection unit, and a third system connector, the drive voltage generator provides a plurality of drive voltages required for the timing controller to the timing controller directly through the source printed circuit board and provides a plurality of drive voltages required for the system to the system through the first system connector, the system connection unit, and the second system connector, and the drive voltage generator provides a plurality of drive voltages required for the gate integrated circuits to the gate integrated circuits through the at least one data circuit film, the liquid crystal panel, and a gate circuit film.

When the drive voltage generator is integrally formed on the system, the system is electrically connected to the at least one source printed circuit board through a first system connector, a system connection unit, and a second system connector, and the backlight drive unit is electrically connected to the system through a first backlight connector, a backlight connection unit, and a second backlight connector.

The drive voltage generator provides drive voltages required for the data integrated circuits to the data integrated circuits through the second system connector, the system connection unit, the first system connector, one source printed circuit board, and the data circuit films and provides drive voltages required for the data integrated circuits to the data integrated circuits by additionally using a first sub-connector, a sub-connector, and a second sub-connector connected between the source printed circuit boards, the drive voltage generator provides a plurality of drive voltages required for the backlight drive unit to the backlight drive unit through the first backlight connector, the backlight connection unit, and the second backlight connector, and the drive voltage generator provides a plurality of drive voltages required for the gate integrated circuits to the gate integrated circuits through the first system connector, the system connection unit, and the second system connector, the one source printed circuit board, the data circuit films, the liquid crystal panel, and a gate circuit film.

The liquid crystal display according to the embodiments of the present invention has a variety of features and advantages. For example, the liquid crystal display uses a drive voltage generator provided on a control printed circuit board, a source printed circuit board, or a system to supply all drive powers of different voltage levels required to drive the drive circuits, the system, and the backlight drive unit. Accordingly, it is possible to simplify the structure for supplying internal drive power of the liquid crystal display, thereby simplifying the manufacturing processes of LCDs and reducing the manufacturing costs thereof.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to a liquid crystal display according to the preferred embodiments of the present invention, examples of which are illustrated in the accompanying drawings. Wherever possible, the same reference numbers will be used throughout the drawings to refer to the same or like parts.

Figure 1:
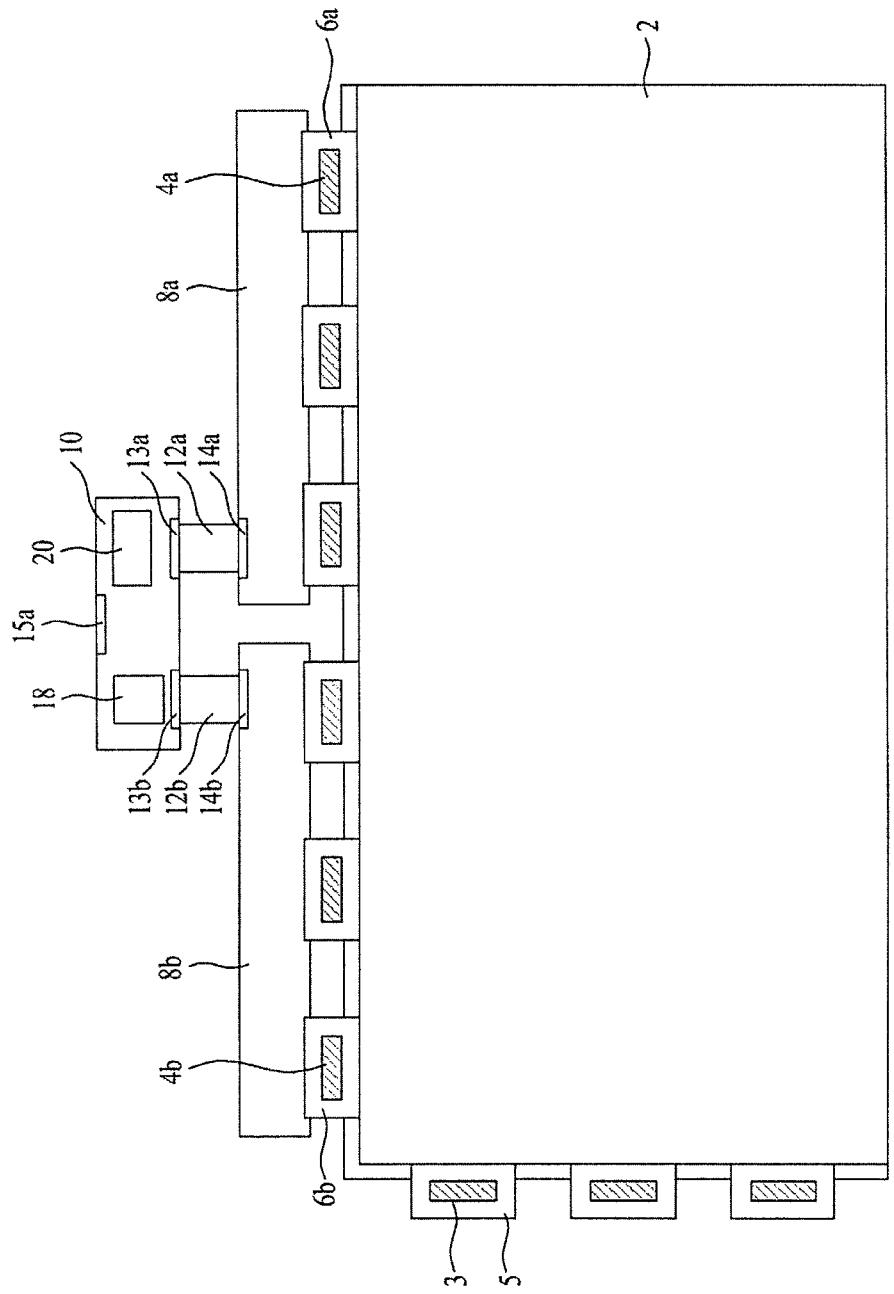
FIG. 1 is a schematic front view of a Liquid Crystal Display (LCD) according to an embodiment of the present invention.
Figure 2:
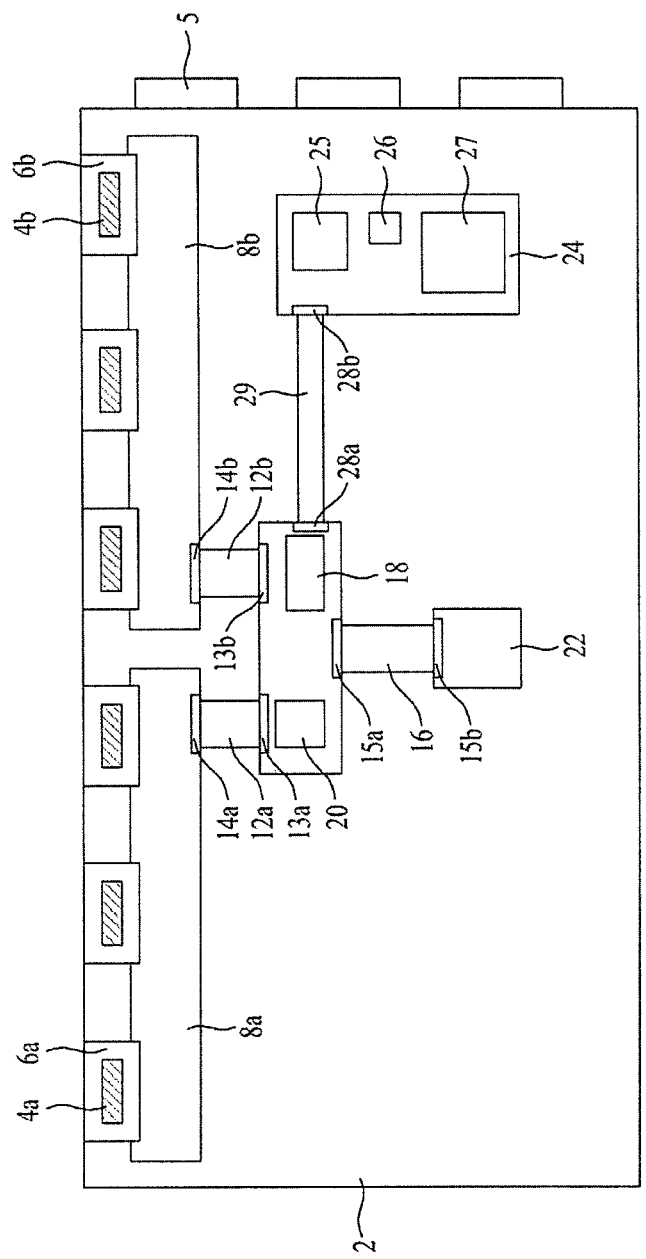
FIG. 2 is a rear view of the LCD shown in FIG. 1.

FIG. 1 is a schematic front view of a Liquid Crystal Display (LCD) according to an embodiment of the present invention and FIG. 2 is a rear view of the LCD shown in FIG. 1.

As shown in FIGS. 1 and 2, the LCD of the present invention includes a liquid crystal panel 2, a drive unit, a controller, a backlight drive unit 24, and a drive voltage generator 20. The liquid crystal panel 2 includes at least one image display region. The drive unit drives gate and data lines included in the liquid crystal panel 2. The controller controls the drive unit using image data and synchronization signals received from the outside. The backlight drive unit 24 drives a backlight to provide light to the liquid crystal panel 2 under control of the controller. The drive voltage generator 20 provided on a system 22, a control printed circuit board 10, or source printed circuit boards 8a and 8b, on which at least one of the drive unit or the controller is formed, converts a voltage level of a drive power received from the outside to generate respective drive powers of different voltage levels and provides the generated respective drive powers of the different voltage levels to the drive unit, the controller, and the backlight drive unit 24.

More specifically, the liquid crystal panel 2 includes a Thin Film Transistor (TFT), formed in each of a plurality of pixel regions defined by a plurality of gate lines and a plurality of data lines, and a liquid crystal capacitor connected to the TFT. The liquid crystal capacitor includes a pixel electrode connected to the TFT and a common electrode provided between the pixel electrode and the liquid crystal layer. In response to a scan pulse from each gate line, the TFT provides an image signal from the data line to the pixel electrode. The liquid crystal capacitor stores a difference voltage between the image signal provided to the pixel electrode and a reference common voltage provided to the common electrode and changes the arrangement of liquid crystal molecules of the liquid crystal layer according to the difference voltage to control light transmittance of the liquid crystal layer, thereby implementing grayscale display.

The liquid crystal panel 2 can be divided into a plurality of regions according to the size thereof. Specifically, as shown in FIG. 2, the liquid crystal panel 2 can be divided into first and second regions according to the number of the source printed circuit boards 8a and 8b. That is, the liquid crystal panel 2 may be divided into first and second regions according to the first and second source printed circuit boards 8a and 8b and may also be divided into a plurality of regions corresponding to the number of the data integrated circuits 4a and 4b. However, the following description will be given with reference to an example wherein the liquid crystal panel 2 is divided into first and second regions according to the first and second source printed circuit boards 8a and 8b.

The drive unit that drives the liquid crystal panel 2 includes a plurality of data integrated circuits 4a and 4b and a plurality of gate integrated circuits 3. The data integrated circuits 4a and 4b are provided between one side of the liquid crystal panel 2 and at least one source printed circuit board 8a and 8b to drive data lines provided on the at least one image display region. The gate integrated circuits 3 are provided on another side of the liquid crystal panel 2 to drive gate lines provided on the at least one image display region.

The plurality of data integrated circuits 4a and 4b are mounted respectively on data circuit films 6a and 6b and connected between the liquid crystal panel 2 and the source printed circuit boards 8a and 8b. The gate integrated circuits 3 are mounted on the gate circuit film 5 and connected to the liquid crystal panel 2.

A Tape Carrier Package (TCP) film or COF film may be used for each of the gate and data circuit films 5, 6a, and 6b. Especially, the data circuit films 6a and 6b are attached between the source printed circuit boards 8a and 8b and the liquid crystal panel 2 according to a Tape Automated Bonding (TAB) scheme. In this case, the data integrated circuits 4a and 4b are electrically connected to a timing controller 18 via the data circuit films 6a and 6b and one of the source printed circuit boards 8a and 8b, and the gate integrated circuits 3 are electrically connected to the timing controller 18 via the gate circuit film 5, the liquid crystal panel 2, the data circuit films 6a and 6b, and the source printed circuit boards 8a and 8b. Here, the number of the gate and data integrated circuits 3, 4a, and 4b is not limited to that illustrated in FIGS. 1 and 2.

Each of the data integrated circuits 4a and 4b provided in the data drive unit provides an analog image signal to each data line using a data control signal received from the timing controller 18, for example, using a Source Start Pulse (SSP) signal, a Source Shift Clock (SSC) signal, and a Source Output Enable (SOE) signal. Specifically, each of the data integrated circuits 4a and 4b latches a digital data signal received according to an SSC and outputs an analog image signal on a horizontal line basis in response to an SOE signal received through the timing controller 18. The data integrated circuits 4a and 4b convert image data of each horizontal line into an analog image voltage, i.e., an analog image signal, and output the image signal.

The gate integrated circuit 3 provided in each gate drive unit provides a scan pulse or gate low voltage to each gate line using a gate control signal received from the timing controller 18, for example, using a Gate Start Pulse (GSP) signal, a Gate Shift Clock (GSC) signal, and a Gate Output Enable (GOE) signal. Specifically, each gate integrated circuit 3 shifts the GSP from the timing controller 18 according to the GSC and sequentially provides a scan pulse having a gate high voltage to each gate line. In addition, each gate integrated circuit 3 provides a gate low voltage to each gate line during a period in which no scan pulse is provided.

The controller which controls the plurality of gate and data integrated circuits 3, 4a, and 4b includes a timing controller 18 which is provided on one of the at least one source printed circuit board 8a and 8b or the system 22 and controls the gate and data integrated circuits 3, 4a, and 4b according to image data and synchronization signals received from the system 22. Although the timing controller 18 may be formed on each of the source printed circuit boards 8a and 8b, it may also be formed on the control printed circuit board 10 that is formed separately from the source printed circuit boards 8a and 8b. The timing controller 18 may also be integrally formed on the system 22, separately from the source printed circuit boards 8a and 8b or from the control printed circuit board 10. First, the following description will be given of the case where the timing controller 18 is formed on the control printed circuit board 10 formed separately from the source printed circuit boards 8a and 8b.

When the timing controller 18 is formed on the control printed circuit board 10, the timing controller 18 is electrically connected to the system 22 through the first system connector 15a, the system connection unit 16, and the second system connector 15b as shown in FIG. 2 and receives image data and a variety of synchronization signals from the system 22. This timing controller 18 arranges image data received through the system 22 so as to be suitable for driving the liquid crystal panel 2 and provides the arranged image data on a horizontal line or frame basis to each of the data integrated circuits 4a and 4b. The timing controller 18 also generates a gate control signal using synchronization signals received from the outside, for example, using a dot clock signal, a data enable signal, and horizontal and vertical synchronization signals and controls the gate integrated circuits 3 using the gate control signals. The timing controller 18 also generates data control signals using the synchronization signals and controls the data integrated circuits 4a and 4b using the data control signals.

The backlight drive unit 24 includes an inverter controller 25 and an inverter 27. The inverter controller 25 outputs a Pulse Width Modulation (PWM) signal in response to a backlight on-off control signal, i.e., a dimming control signal, received from the system 22 or the timing controller 18. The inverter 27 drives a plurality of light sources provided in the backlight in response to the PWM signal.

The backlight not shown in the drawings includes a plurality of light sources that emit light to the liquid crystal panel 2 and an optical unit that improves the efficiency of light incident from each light source. The light sources of the backlight may include cylindrical lamps such as a Cold Cathode Fluorescent Lamp (CCFL), an External Electrode Fluorescent Lamp (EEFL), and a Hot Cathode Fluorescent Lamp (HCFL) and may also include Red (R), Green (G), and Blue (B) Light Emitting Diodes (LEDs). These light sources are driven by lamp drive signals from the inverter 27 and generate light.

The inverter controller 25 generates a PWM signal according to a dimming control signal with a changed duty ratio from the system 22 or the timing controller 18 and provides the PWM signal to the inverter 27. Here, since a plurality of inverters 27 may be provided according to the number of the light sources, PWM signals may be sequentially or simultaneously provided to the inverters 27. That is, each PWM signal may be a signal with on/off periods (for example, high/low periods) of the light sources that have been changed according to the duty ratio of the dimming control signal.

The inverter 27 generates an AC drive signal for driving the light sources. Here, the inverter 27 may also operate in a burst mode in which it turns on/off the lamps by providing or not providing AC drive signals according to the PWM signals received from the inverter controller 25.

The drive voltage generator 20 includes at least one DC/DC converter and is provided on one of the at least one source printed circuit board 8a and 8b, the system 22, or the control printed circuit board 10. The drive voltage generator 20 increases or decreases the voltage level of a voltage signal received from the outside to generate respective drive powers, i.e., respective drive voltages, required to drive the plurality of gate and data integrated circuits 3, 4a, and 4b, the timing controller 18, the system 22, and the backlight drive unit 24. The drive voltage generator 20 provides the generated drive voltages having the respective levels to the plurality of gate and data integrated circuits 3, 4a, and 4b, the timing controller 18, the system 22, and the backlight drive unit 24, respectively. The drive voltage generator 20 also generates a gamma reference voltage causing the data integrated circuits 4a and 4b to convert digital image data into an analog image signal and provides the gamma reference voltage to the data integrated circuits 4a and 4b. The drive voltage generator 20 generates a gate high voltage corresponding to the gate high voltage of the scan pulse and a gate low voltage corresponding to the low voltage of the scan pulse and provides the generated gate high and low voltages to the gate integrated circuits 3.

More specifically, in the case where the drive voltage generator 20, together with the timing controller 18, is formed on the control printed circuit board 10 as shown in FIG. 2, the drive voltage generator 20 provides a plurality of drive voltages required for the data integrated circuits 4a and 4b to the data integrated circuits 4a and 4b through at least one first data connector 13a and 13b, at least one data connection unit 12a and 12b, at least one second data connector 14a and 14b, at least one source printed circuit board 8a and 8b, and the data circuit films 6a and 6b. The drive voltage generator 20 also provides a plurality of drive voltages required for the backlight drive unit 24 to the backlight drive unit 24 through the first backlight connector 28a, the backlight connection unit 29, and the second backlight connector 28b. The drive voltage generator 20 also provides a plurality of drive voltages required for the timing controller 18 to the timing controller 18 directly through the control printed circuit board 10 and provides a plurality of drive voltages required for the system 22 to the system 22 through the first system connector 15a, the system connection unit 16, and the second system connector 15b. The drive voltage generator 20 also provides a plurality of drive voltages required for the gate integrated circuits 3 to the gate integrated circuits 3 through at least one first data connector 13a and 13b, at least one data connection unit 12a and 12b, at least one second data connector 14a and 14b, at least one source printed circuit board 8a and 8b, one of the data circuit films 6a and 6b, the liquid crystal panel 2, and the gate circuit film 5. Here, connection units such as the system connection unit 16 or the backlight connection unit 29 may be a flexible printed circuit or a flexible flat cable and may also be an anisotropic conductive film.

Figure 3:
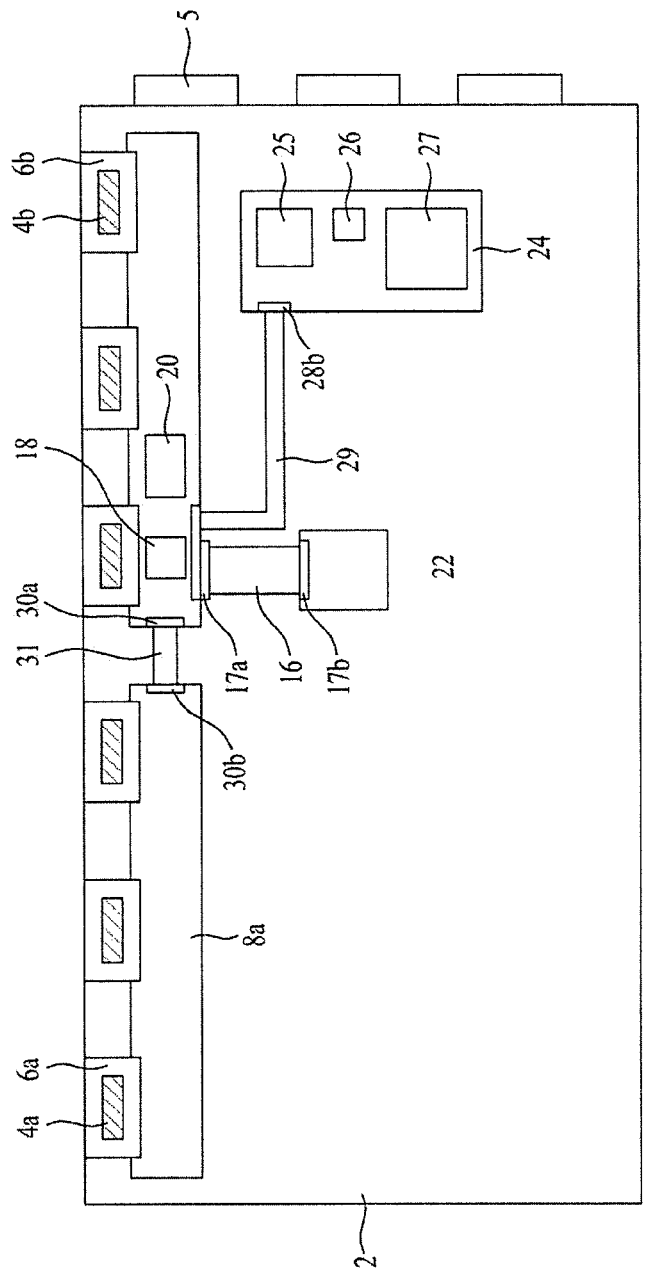
FIG. 3 is a rear view of an LCD according to another embodiment of the present invention.

FIG. 3 is a rear view of an LCD according to another embodiment of the present invention.

In the LCD shown in FIG. 3, the timing controller 18 and the drive voltage generator 20 are formed on one of the source printed circuit boards 8a and 8b and the system 22 is electrically connected to the timing controller 18 and the drive voltage generator 20 through a third system connector 17a, a system connection unit 16, a fourth system connector 17b, and the source printed circuit boards 8a and 8b. The backlight drive unit 24 is electrically connected to the timing controller 18 and the drive voltage generator 20 through the second backlight connector 28b, the backlight connection unit 29, and the third system connector 17a.

In the LCD constructed as described above, the drive voltage generator 20 provides drive voltages required for the data integrated circuits 4a and 4b to the data integrated circuits 4a and 4b through at least one source printed circuit board 8a and 8b and the data circuit films 6a and 6b and also provides drive voltages required for the data integrated circuits 4a and 4b additionally using a first sub-connector 30a, a sub-connection unit 31, a second sub-connector 30b, or the like connected between the source printed circuit boards 8a and 8b. The drive voltage generator 20 provides drive voltages required for the backlight drive unit 24 to the backlight drive unit 24 through the third system connector 17a, the backlight connection unit 29, and the fourth system connector 17b. The drive voltage generator 20 provides drive voltages required for the timing controller 18 to the timing controller 18 directly through the source printed circuit boards 8a and 8b and provides drive voltages required for the system 22 to the system 22 through the third system connector 17a, the system connection unit 16, and the fourth system connector 17b. The drive voltage generator 20 provides drive voltages required for the gate integrated circuits 3 to the gate integrated circuits 3 through the at least one data circuit films 6a and 6b, the liquid crystal panel 2, and the gate circuit film 5.

Figure 4:
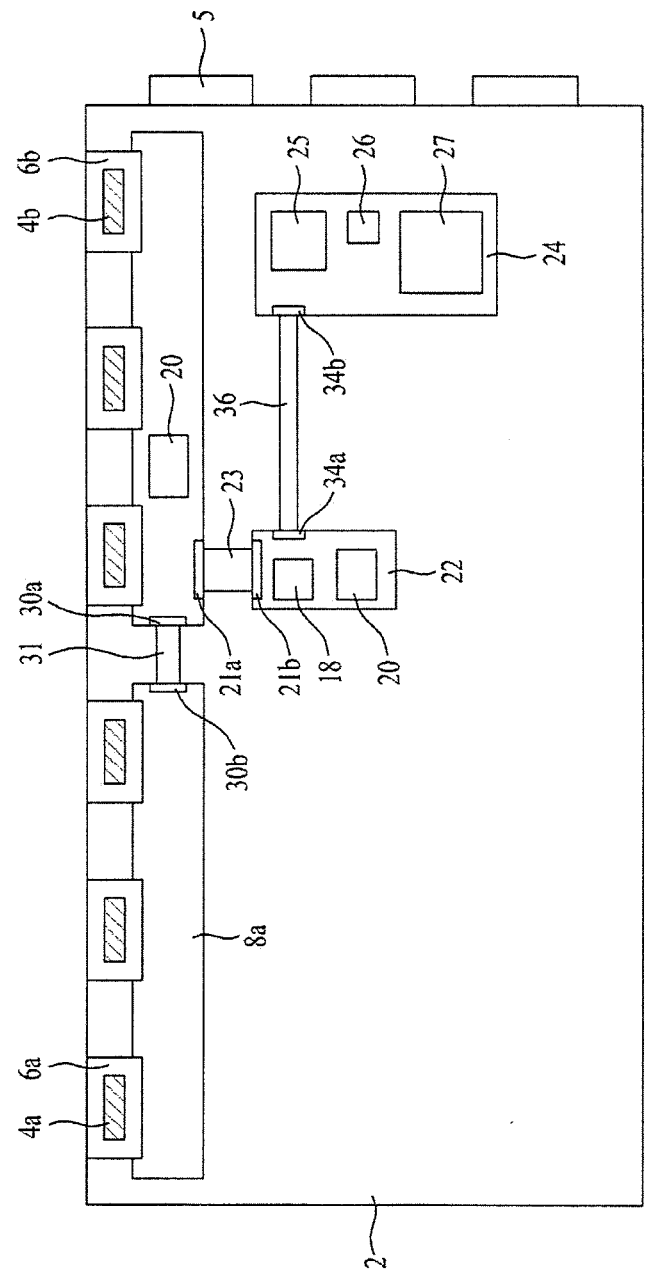
FIG. 4 is a rear view of an LCD according to another embodiment of the present invention.

FIG. 4 is a rear view of an LCD according to another embodiment of the present invention.

In the LCD shown in FIG. 4, the timing controller 18 and the drive voltage generator 20 are integrally formed on the system 22. Accordingly, the system 22, on which the timing controller 18 and the drive voltage generator 20 are formed, are connected to the at least one source printed circuit board 8a and 8b through the fifth system connector 17a, the system connection unit 16, and the sixth system connector 17b. The backlight drive unit 24 is electrically connected to the system 22 through the fourth backlight connector 34b, the backlight connection unit 29, and the fifth backlight connector 34a.

In the LCD constructed as described above, the drive voltage generator 20 provides drive voltages required for the data integrated circuits 4a and 4b to the data integrated circuits 4a and 4b through the sixth system connector 17b, the system connection unit 16, the fifth system connector 17a, one of the source printed circuit boards 8a and 8b, and the data circuit films 6a and 6b and also provides drive voltages required for the data integrated circuits 4a and 4b additionally using the first sub-connector 30a, the sub-connection unit 31, the second sub-connector 30b, or the like connected between the source printed circuit boards 8a and 8b. The drive voltage generator 20 provides drive voltages required for the backlight drive unit 24 to the backlight drive unit 24 through the fifth backlight connector 34a, the backlight connection unit 29, and the fourth backlight connector 34b. Here, the drive voltage generator 20 may also directly provide the required drive voltages respectively to the timing controller 18 and the system 22. The drive voltage generator 20 provides drive voltages required for the gate integrated circuits 3 to the gate integrated circuits 3 through the sixth system connector 17b, the system connection unit 16, the fifth system connector 17a, the source printed circuit boards 8a and 8b, the data circuit films 6a and 6b, the liquid crystal panel 2, and the gate circuit film 5.

As described above, the LCD of the present invention provides all required drive voltages to the plurality of gate and data integrated circuits 3, 4a, and 4b, the timing controller 18, the system 22, and the backlight drive unit 24 using the drive voltage generator 20 provided on the system 22, one of the source printed circuit boards 8a and 8b, or the control printed circuit board 10. Since the configuration of the LCD of the present invention can be simplified as described above, the present invention can simplify manufacturing processes of LCDs and reduce manufacturing costs thereof.

The liquid crystal display according to the embodiments of the present invention has a variety of features and advantages. For example, the liquid crystal display uses a drive voltage generator provided on a control printed circuit board, a source printed circuit board, or a system to supply all drive powers of different voltage levels required to drive the drive circuits, the system, and the backlight drive unit. Accordingly, it is possible to simplify the structure for supplying internal drive power of the liquid crystal display, thereby simplifying the manufacturing processes of LCDs and reducing the manufacturing costs thereof.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A liquid crystal display comprising:
   a liquid crystal panel including at least one image display region;
   a drive unit for driving gate and data lines included in the liquid crystal panel;
   a controller for controlling the drive unit using image data and synchronization signals received from outside;
   a backlight drive unit for driving a backlight to provide light to the liquid crystal panel under control of the controller; and
   a timing controller and a drive voltage generator formed on one of the source printed circuit boards, the drive voltage generator converting a voltage level of a drive power received from outside to generate respective drive powers of different voltage levels and providing the generated respective drive powers of the different voltage levels to the drive unit, the controller, and the backlight drive unit,
   wherein the drive voltage generator provides drive voltages required for the data integrated circuits to the data integrated circuits through at least one source printed circuit board and the data circuit films, and also provides drive voltages required for the data integrated circuits additionally using a first sub-connector, a sub-connection unit, or a second sub-connector connected between the source printed circuit boards.

2. The liquid crystal display according to claim 1, wherein the drive unit includes:
   a plurality of data integrated circuits provided between one side of the liquid crystal panel and the at least one source printed circuit board for driving data lines provided in the at least one image display region; and
   a plurality of gate integrated circuits provided on another side of the liquid crystal panel for driving data lines provided in the at least one image display region.

3. The liquid crystal display according to claim 2, wherein the drive voltage generator includes at least one DC/DC converter, increases or decreases the voltage level of the drive power received from outside to a plurality of levels to generate respective drive voltages required to drive the plurality of gate and data integrated circuits, the timing controller, the system, and the backlight drive unit, and provides the generated drive voltages respectively to the plurality of gate and data integrated circuits, the timing controller, the system, and the backlight drive unit.

4. The liquid crystal display according to claim 3, wherein the drive voltage generator generates a gamma reference voltage that enables the data integrated circuits to convert the image data into an analog image signal and provides the generated gamma reference voltage to the data integrated circuits, generates respective gate drive voltages corresponding to a gate high voltage and a gate low voltage generated from the gate integrated circuits and provides the gate drive voltages to the gate integrated circuits, and generates a drive voltage corresponding to a backlight control signal required for on-off drive control of the backlight and provides the drive voltage corresponding to the backlight control signal to the backlight drive unit.

5. The liquid crystal display according to claim 4, wherein, when the drive voltage generator is formed on one source printed circuit board, the system is electrically connected to the timing controller and the drive voltage generator through a first system connector, a system connection unit, a second system connector, and the source printed circuit board, and
   wherein the backlight drive unit is electrically connected to the timing controller and the drive voltage generator through a first backlight connector, a backlight connection unit, and the second system connector.

6. The liquid crystal display according to claim 5, wherein
   the drive voltage generator provides a plurality of drive voltages required for the backlight drive unit to the backlight drive unit through the second system connector, the backlight connection unit, and a third system connector,
   the drive voltage generator provides a plurality of drive voltages required for the timing controller to the timing controller directly through the source printed circuit board and provides a plurality of drive voltages required for the system to the system through the first system connector, the system connection unit, and the second system connector, and
   the drive voltage generator provides a plurality of drive voltages required for the gate integrated circuits to the gate integrated circuits through the at least one data circuit film, the liquid crystal panel, and a gate circuit film.

* * * * *